(12) United States Patent
Yoon

(10) Patent No.: US 7,474,587 B2
(45) Date of Patent: Jan. 6, 2009

(54) FLASH MEMORY DEVICE WITH RAPID RANDOM ACCESS FUNCTION AND COMPUTING SYSTEM INCLUDING THE SAME

(75) Inventor: Chi-Weon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 8 days.

(21) Appl. No.: 11/673,996

(22) Filed: Feb. 12, 2007

(65) Prior Publication Data

US 2007/0189105 A1 Aug. 16, 2007

(30) Foreign Application Priority Data

Feb. 16, 2006 (KR) .................... 10-2006-0015208

(51) Int. Cl.
G11C 8/00 (2006.01)
(52) U.S. Cl. ..................... 365/230.08; 365/189.04; 365/239
(58) Field of Classification Search ............. 365/230.09
See application file for complete search history.

(56) References Cited

U.S. PATENT DOCUMENTS

| | | | | |
|---|---|---|---|---|
| 5,293,347 | A * | 3/1994 | Ogawa ................... | 365/230.01 |
| 5,793,665 | A | 8/1998 | Kim et al. | |
| 5,901,086 | A * | 5/1999 | Wang et al. ............ | 365/185.21 |
| 5,923,615 | A * | 7/1999 | Leach et al. ............ | 365/238.5 |
| 6,456,519 | B1 | 9/2002 | McClure | |
| 6,470,431 | B2 * | 10/2002 | Nicosia et al. .......... | 711/157 |
| 6,552,936 | B2 | 4/2003 | Shiga et al. | |
| 7,079,445 | B2 * | 7/2006 | Choi et al. ............. | 365/189.02 |

| | | |
|---|---|---|
| 2005/0135145 | A1 | 6/2005 Lee et al. |

FOREIGN PATENT DOCUMENTS

| | | |
|---|---|---|
| JP | 09-185894 | 7/1997 |
| JP | 2002-216483 | 8/2002 |
| JP | 2002-244920 | 8/2002 |
| JP | 2005-182996 | 7/2005 |
| KR | 0147706 | 5/1998 |
| KR | 2001-0100859 | 11/2001 |
| KR | 2004-0034825 | 4/2004 |
| KR | 2004-0089895 | 10/2004 |
| KR | 2005-0062744 | 6/2005 |
| KR | 2005-0099329 | 10/2005 |

OTHER PUBLICATIONS

English language abstract of Korean Publication No. 0147706.

(Continued)

Primary Examiner—Tan T. Nguyen
(74) Attorney, Agent, or Firm—Marger Johnson & McCollom, P.C.

(57) ABSTRACT

A flash memory device includes a memory cell array, an address buffer circuit including address buffers, each address buffer configured to store an address for a random read operation, a read circuit configured to sense data from the memory cell array in response to an address output from the address buffer circuit, an output data latch circuit configured to receive data sensed by the read circuit, and a control logic coupled to the address buffer circuit, the read circuit, and the output data latch circuit, and configured to control the output data latch circuit and the read circuit such that the output data latch circuit outputs first data read from the memory cell array substantially simultaneously as the read circuit senses second data from the memory cell array.

21 Claims, 5 Drawing Sheets

OTHER PUBLICATIONS

English language abstract of Korean Publication No. 2005-0062744.
English language abstract of Japanese Publication No. 09-185894.
English language abstract of Japanese Publication No. 2002-216483.
English language abstract of Japanese Publication No. 2005-182996.

* cited by examiner

FLASH MEMORY DEVICE WITH RAPID RANDOM ACCESS FUNCTION AND COMPUTING SYSTEM INCLUDING THE SAME

CROSS-REFERENCE TO RELATED APPLICATIONS

This U.S. non-provisional patent application claims priority under 35 U.S.C. §119 of Korean Patent Application No. 2006-0015208 filed on Feb. 16, 2006, the entire contents of which are hereby incorporated by reference.

BACKGROUND

This disclosure relates to a semiconductor memory device, and more particularly, to a nonvolatile memory device supporting a random read operation.

Of non-volatile memory devices, a NOR flash memory device can provide a random read operation. In the random read operation, when an address (including row and column addresses) is input to the NOR flash memory device, the NOR flash memory device outputs data of the input address to an outside after an elapse of a predetermined read time (hereinafter, referred to as 'initial read time'). In the case of a NOR flash memory device, when a new address is input while sensing/outputting the data of the input address, a sensing operation is performed according to the input of the new address, whereas the data currently sensed/output will be processed as invalid data.

Therefore, in the operation of a NOR flash memory device, a delay of the initial read time (or initial read operation) will be required between each address input for a random read operation. In other words, the NOR flash memory device performs a sensing operation according to an input of N-th address, and outputs data to an outside as a result of the sensing operation. After the data of the N-th address is output, the NOR flash memory device receives (N+1)-th data loaded from an outside to perform a sensing operation. To continuously perform the random read operation, the NOR flash memory device needs a section (hereinafter, referred to as 'initial read section') corresponding to the initial read time when an address is input. The initial read section of this type acts as a limiting factor in shortening the time necessary for continuous random read operation.

SUMMARY

An embodiment includes a flash memory device including a memory cell array, an address buffer circuit including address buffers, each address buffer configured to store an address for a random read operation, a read circuit configured to sense data from the memory cell array in response to an address output from the address buffer circuit, an output data latch circuit configured to receive data sensed by the read circuit, and a control logic coupled to the address buffer circuit, the read circuit, and the output data latch circuit, and configured to control the output data latch circuit and the read circuit such that the output data latch circuit outputs first data read from the memory cell array substantially simultaneously as the read circuit senses second data from the memory cell array.

Another embodiment includes a method of operating a flash memory device including storing a first address in an address buffer, storing a second address in the address buffer, sensing data in a first memory cell in a memory cell array substantially simultaneously as storing the second address in the address buffer, the first memory cell corresponding to the first address, outputting the data from the first memory cell, and sensing data in a second memory cell in the memory cell array substantially simultaneously as outputting the data from the first memory cell, the second memory cell corresponding to the second address.

BRIEF DESCRIPTION OF THE FIGURES

Non-limiting and non-exhaustive embodiments will be described with reference to the following figures, wherein like reference numerals refer to like parts throughout the various figures unless otherwise specified. In the figures.

DETAILED DESCRIPTION

Embodiments will now be described in reference to the accompanying drawings. Wherever possible, the same reference numbers will be used throughout the drawings to refer to the same or like parts.

Embodiments of flash memory device are described below. An example of such a flash memory device is a NOR flash memory device. However, those skilled in the art will understand that advantages and operations of the embodiments described herein can be implemented or applied in other types of flash memory devices beyond a NOR flash memory device. In addition, embodiments may be modified or altered without deviating from the scope of this disclosure.

Figure 1:
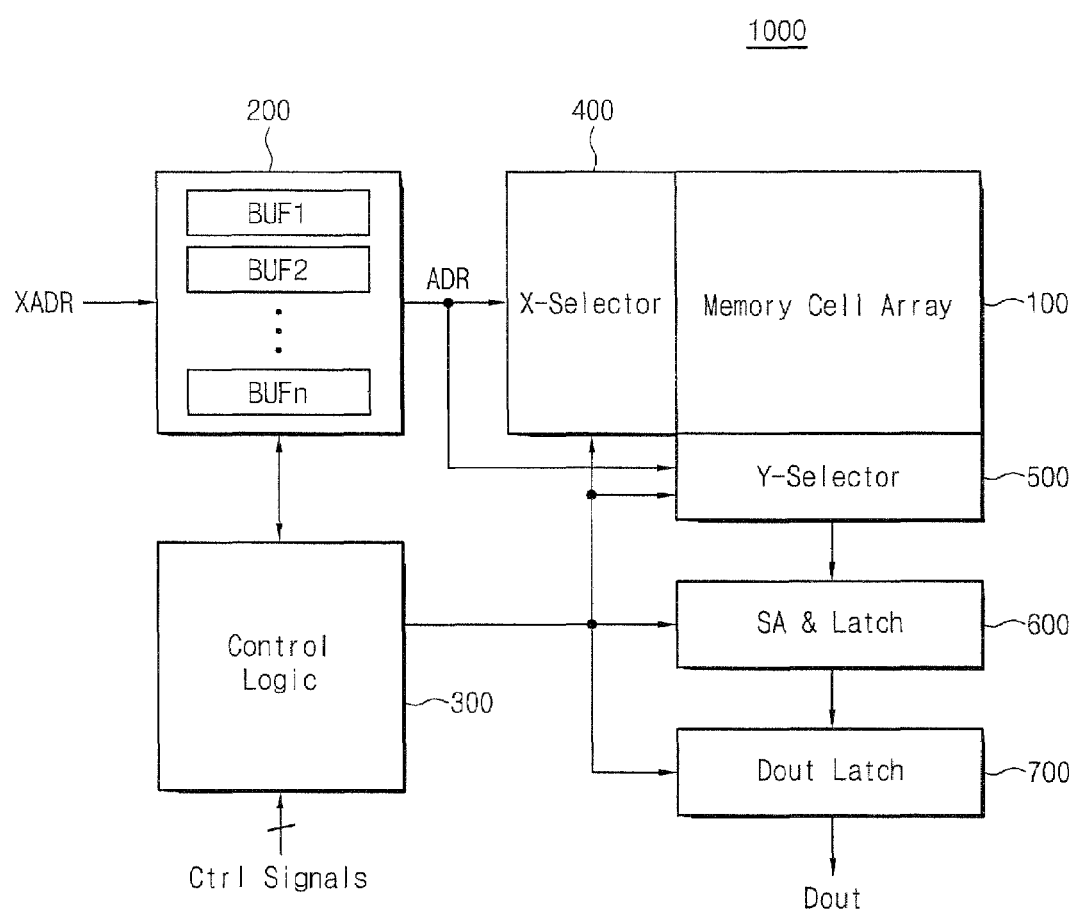
FIG. 1 is a block diagram illustrating a flash memory device according to an embodiment.

FIG. 1 is a block diagram illustrating a flash memory device 1000 according to an embodiment. The flash memory device 1000 includes a memory cell array 100, an address buffer circuit 200, a control logic 300, a row selection circuit (or X-selector) 400, a column selection circuit (or Y-selector) 500, a sensing and latch circuit (or SA & latch) 600, and an output data latch circuit (or Dout latch) 700.

Although not shown in the drawings, the memory cell array 100 includes a plurality of memory cells arranged in rows (or word lines) and columns (or bit lines). In an example of such a memory cell array 100, each memory cell can include a floating gate transistor. However, the structure of the memory cells is not limited only to the floating gate transistor type structures. The address buffer circuit 200 is a circuit for storing an address XADR supplied to the flash 20 memory device 1000 from an external source (e.g., a memory controller or host). The address buffer is configured to store the address XADR in response to a control of the control logic 300. In one embodiment, the address XADR is temporarily stored in the address buffer circuit 200.

The address buffer circuit 200 includes buffers BUF1 to BUFn. Each of the buffers BUF1 to BUFn temporarily stores the external address XADR under the control of the control logic 300. Storing external addresses XADR in the address buffers BUF1 to BUFn can be performed using a variety of techniques. For example, the address buffer circuit 200 can be implemented so as to operate in a first-in first-out (FIFO) manner. In one embodiment, a number of the address buffers BUF1 to BUFn are included in the address buffer circuit 200 corresponding to a maximum number of pending requests of random read operation. Using the buffers BUF1 to BUFn in the address buffer circuit 200, the external addresses XADR input to the flash memory device 1000 can be stored for random read operations.

Again referring to FIG. 1, the control logic 300 is configured to control operations of the flash memory device 1000 in response to external control signals. The control logic 300 is configured to store an external address XADR in the address buffer circuit 200 that is input while other processing is being performed. For example, the external address XADR can be stored in the address buffer circuit 200 during an initial read operation or a data output operation associated with another address from the address buffer circuit 200. Whether or not the external address XADR has been input can be detected in various ways. For example, the control logic 300 can detect an input of the external address using a control signal nAVD representing that the input address is valid, or through a detection of address transition. Alternatively, the control logic 300 may detect the input of the external address in response to an input of a read command. It is however apparent to those skilled in the art that the address detecting method by the control logic 300 is not limited to those disclosed herein.

In an embodiment, the control logic 300 controls the address buffer circuit 200 such that the addresses stored in the address buffers BUF1 to BUFn are sequentially output to the row selection circuit 400 and the column selection circuit 500 at each ending of the read operation. For example, when the read operation is performed using the address stored in the address buffer BUF1, the control logic 300 controls the address buffer circuit 200 such that the address stored in the address buffer BUF2 is output to the row selection circuit 400 and the column selection circuit 500 after the read operation is ended. In one example, the address can be output to the row selection circuit 400 and the column selection circuit 500 when the read operation has ended.

The row selection circuit 400 is controlled by the control logic 300 to activate at least one of the word lines in the memory cell array 100 in response to the row address signals among the addresses ADR output from the address buffer circuit 200. The column selection circuit 500 is controlled by the control logic 300 to select the bit lines in the memory cell array 100 in response to the column address signals among the addresses ADR output from the address buffer circuit 200. The sensing and latch circuit 600 is controlled by the control logic 300 to sense and latch data from the memory cell array 100 through the bit lines selected by the column selection circuit 500. The output data latch circuit 700 is controlled by the control logic to receive data sensed/latched by the sensing and latch circuit 600 and output the received data from the flash memory device 1000.

As described above, the flash memory device 1000 according to an embodiment is configured to store in the address buffer circuit 200 an address input to the flash memory device 1000 during a sensing operation or data output operation. The flash memory device 1000 according to an embodiment is configured to perform the sensing operation using a new address stored in the address buffer circuit 200 when a sensing operation using to an address input in a previous operation has ended. According to the control method of this type, the input of a new address and the sensing operation corresponding to a different address can be performed at the same time. As a result, it is possible to enhance the read speed of the flash memory device according to the present invention.

Figure 2:
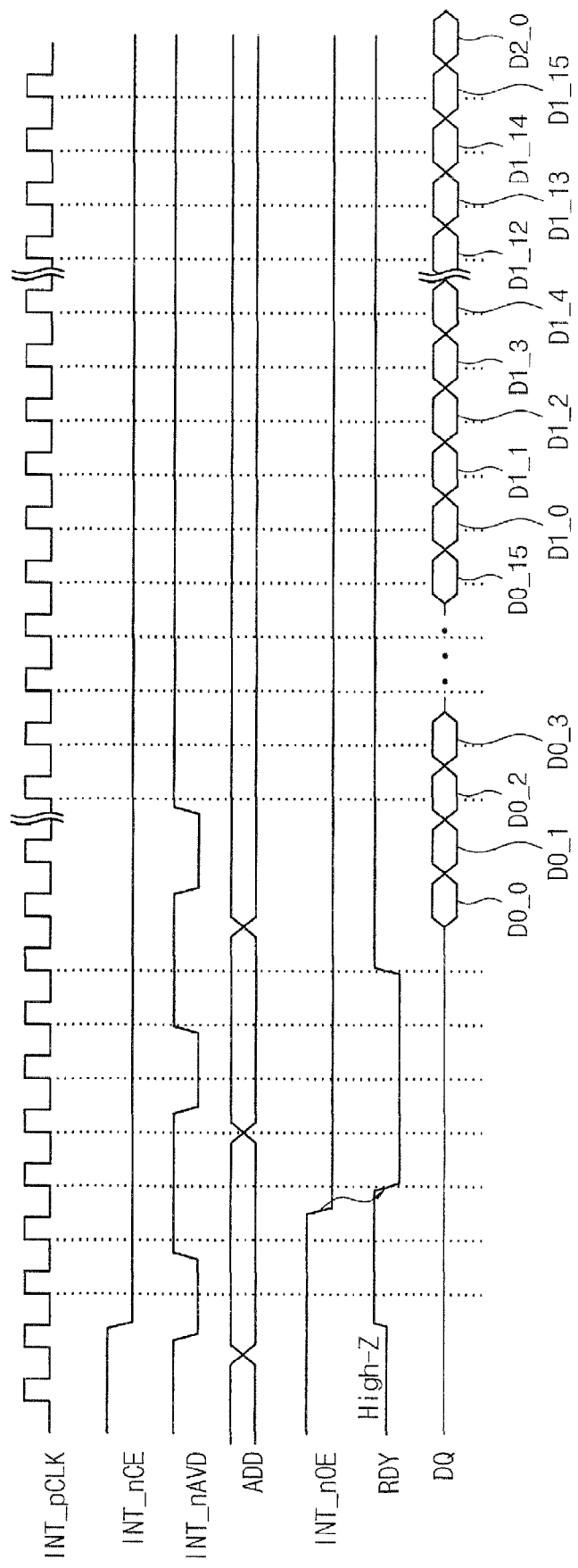
FIG. 2 is a timing diagram for illustrating a random read operation of the flash memory device shown in FIG. 1.

FIG. 2 is an example of a timing diagram for illustrating a random read operation of a flash memory device according to the present invention. A random read operation of a flash memory device according to the present invention will now be described with reference to the accompanying drawings.

To first perform a random read operation, an address ADD1 (including row and column address information) is supplied to the flash memory device 1000 as the external address XADR. The external address XADR is stored in the address buffer BUF1 under the control of the control logic 300. The address ADD1 is transmitted to the row selection circuit 400 and the column selection circuit 500 under the control of the control logic 300. The row selection circuit 400 activates at least one of the word lines of the memory cell array 100 in response to the row address signals among the addresses ADR output from the address buffer circuit 200 under the control of the control logic 300. The column selection circuit 500 selects the bit lines of the memory cell array 100 in response to the column address signals among the addresses ADR output from the address buffer circuit 200 under the control of the control logic 300. The sensing and latch circuit 600 senses and latches data (e.g., 8-word data or 16-word data) from the memory cells of the selected word line through the bit lines selected by the column selection circuit 500 according to the control of the control logic 300. The output data latch circuit 700 receives data sensed/latched by the sensing and latch circuit 600, synchronizes the received data to a clock signal and outputs the synchronized data to the outside.

It is assumed that while an initial read operation including the row and column selection operation and the sensing and latch operation is performed, a second address ADD2 (including the row and column address information) for a second random read operation is supplied to the flash memory device 1000 an external address XADR as shown in FIG. 2. The address ADD2 for the second random read operation is input and stored in the address buffer BUF2 according to the control of the control logic 300 while the initial read operation of the address ADD1 for the first random read operation is being performed. After the data stored in the sensing and latch circuit 600 is output to the output data latch circuit 700 or at the same time when the data stored in the sensing and latch circuit 600 is output to the output data latch circuit 700, the control logic 300 controls the address buffer circuit 200 such that the address ADD2 stored in the address buffer BUF2 is transmitted to the row selection circuit 400 and the column selection circuit 500. As the address ADD2 is transmitted to the row selection circuit 400 and the column selection circuit 500, an initial read operation is performed similar to that described above. As a result, the initial read section of the second random read operation overlaps in time with the data output section of the first random read operation.

Furthermore, an address ADD3 for a third random read operation can be supplied to the address buffer circuit 200 during the initial read section of the second random read operation. In this example, the address ADD3 for the third random read operation is stored in the address buffer BUF3 under the control of the control logic 300. When the initial read section of the second random read operation elapses, i.e., when the data read by the initial read operation is transmitted to the output data latch circuit 700, the control logic allows the address for the third random read operation to be transmitted to the row selection circuit 400 and the column selection circuit 500. Subsequent operations are performed in the same manner as that described above, and thus their description will be omitted. Like that of the second random read operation, the initial read section of the third random read operation overlaps in time with the data output section of the second random read operation.

Figure 3:
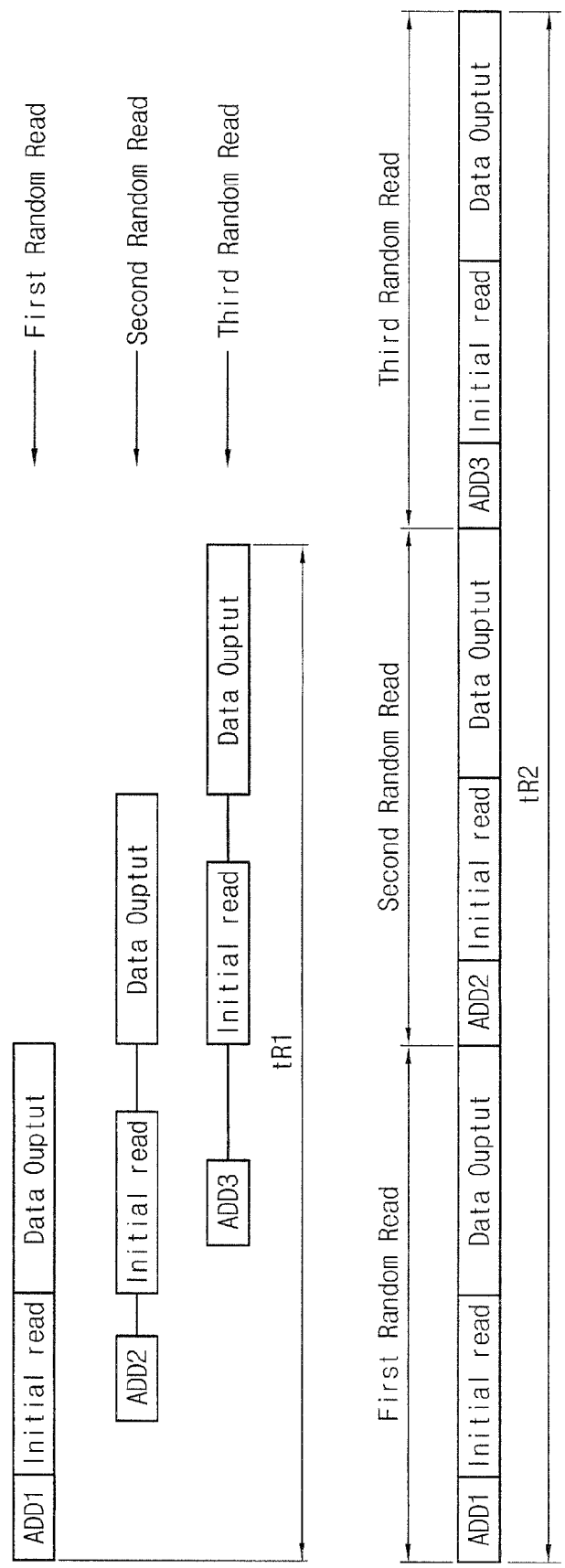
FIGS. 3 and 4 are block diagrams illustrating a read time taken in repeated random read operations.

FIG. 3 is a block diagram illustrating a read time taken in repeated random read operations. In this example, it is assumed that a data output time is longer than a sensing time during an initial read operation. Accordingly, an address ADD1 is stored in the buffer circuit 200 for a first random read operation. The address ADD2 for the second random read operation is stored in the address buffer circuit 200 by the control of the control logic 300 during the initial read section of the first random read operation. The initial read section of the second random read operation overlaps in time with the data output section of the first random read operation.

Likewise, the address ADD3 for the third random read operation is stored in the address buffer circuit 200 by the control of the control logic 300 during the initial read section of the second random read operation. The initial read section of the third random read operation overlaps in time with the data output section of the second random read operation. The first, second, and third random read operations are complete after a time tR1.

Three sequential random read operations are illustrated as occurring over time tR2 for reference, where tR1<tR2. Compared with a flash memory device which has to perform the initial read operation before another address is input, the flash memory device 1000 described above can reduce the read time for continuously requested random read operations.

Figure 4:
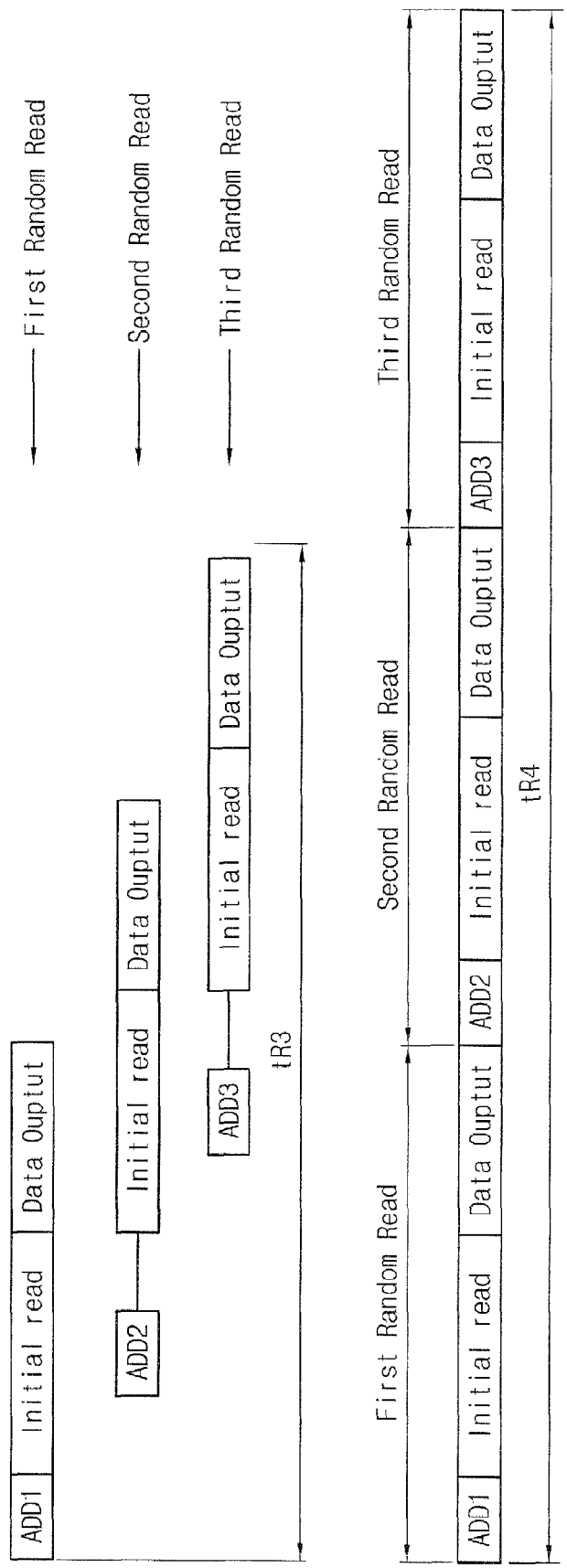

FIG. 4 is a block diagram illustrating a read time taken in repeated random read operations. In this example, it is assumed that a data output time is shorter than a sensing time during an initial read operation. While the data output time is shorter than the sensing time, it is possible to reduce the read time taken in performing continuously requested random read operations. For example, as shown in FIG. 4, addresses can be input during the same time as initial read operations, resulting in a time tR3 for three random read operations. As compared with a time tR4 where tR3<tR4, for three sequential random read operations that must complete an initial read operation before another address is input, the time taken in performing continuously requested random read operations is reduced.

It is apparent to those skilled in the art that a method for loading the external address XADR to the address buffer circuit 200 is not limited only to those disclosed. For example, the addresses necessary for continuously performing the random read operation can be continuously stored in the address buffers BUF1 to BUFn. In such a case, when a first external address is input, the control logic 300 will control the row selection circuit 400, the column selection circuit 500, the sensing and latch circuit 600 and the output data latch circuit 700 such that a sensing operation corresponding to the first address is performed like the aforementioned operation. Thereafter, it is possible to continuously perform a next sensing operation using the address stored in the address buffer circuit 200 at each termination of the sensing operation.

Figure 5:
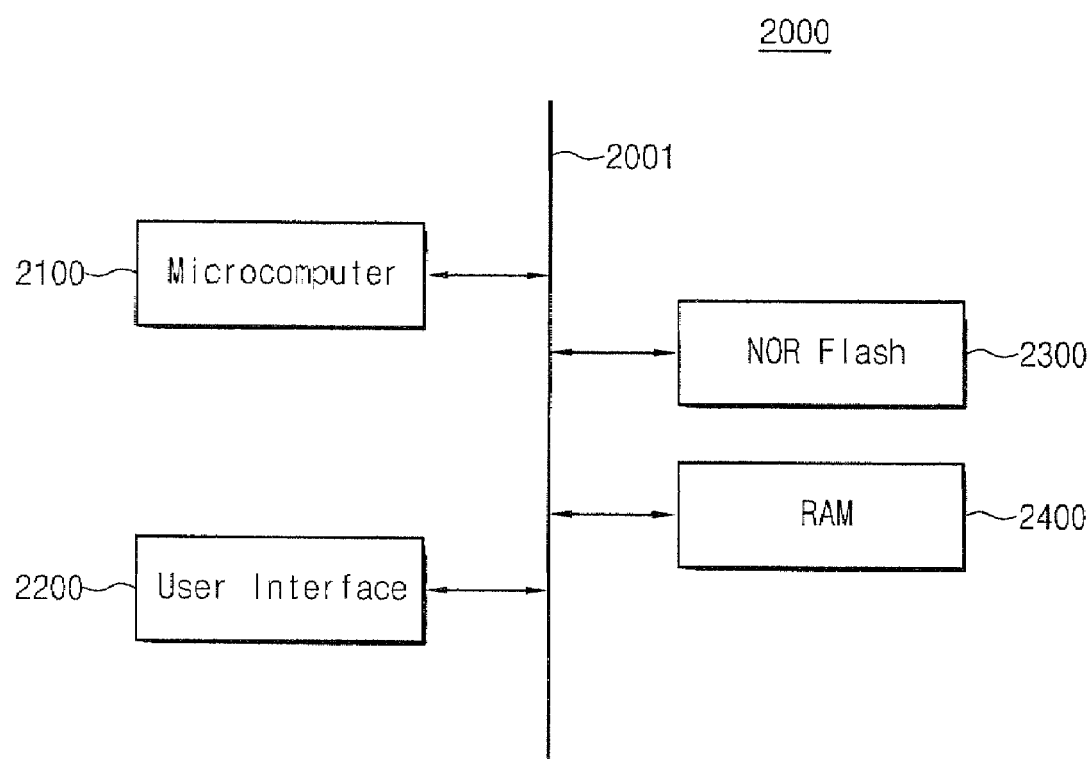
FIG. 5 is a block diagram showing a computing system according to an embodiment.

FIG. 5 is a block diagram schematically illustrating a computing system 2000 according to an embodiment. The computing system 2000 includes a processor 2100, a user interface 2200, a NOR flash memory device 2300, and a RAM 2400. The processor 2100, the user interface 2200, the NOR flash memory device 2300, and the RAM 2400 are electrically connected to a bus 2001. The processor 2100 is configured to control the computing system 2000, and the user interface 2200 provides an interface between the computing system 2000 and a user. The RAM 2400 is used as additional memory. In an embodiment, the NOR flash memory device 2300 is substantially the same as that shown in FIG. 1, and thus its description will be omitted. When a random read operation is continuously requested by the processor 2100, the NOR flash memory device 2300 outputs data continuously in the same way as that described above. Accordingly, it is possible to enhance the operation performance of the computing system 2000.

The processor 2100 can be any kind of processing device. For example, the processor 2100 can be a microprocessor, a microcomputer, a programmable logic device, a multi-processor system, a digital signal processor, or the like.

A NOR flash memory device according to an embodiment can have an enhanced read speed. In addition, a NOR flash memory device according to an embodiment that can have a minimized initial read time.

An embodiment includes a NOR flash memory device including a memory cell array; an address buffer circuit having address buffers each storing an external address for a random read operation; a read circuit for sensing data from the memory cell array in response to an address output from the address buffer circuit; an output data latch circuit for receiving data sensed by the read circuit; and a control logic for controlling the address buffer circuit, the read circuit, and the output data latch circuit, wherein the control logic controls the address buffer circuit and the read circuit to perform a sensing operation using the address stored in the address buffer circuit when data from the output data latch circuit is output.

In an embodiment, the control logic controls the address buffer circuit to output addresses stored in address buffers to the read circuit in a FIFO manner.

In an embodiment, the address buffer circuit includes first to third address buffers. The read circuit performs a sensing operation in response to an external address output from the second address buffer under a control of the control logic, when data sensed in response to an external address from the first address buffer is output to the outside through the output data latch circuit. The read circuit performs a sensing operation in response to an external address output from the third address buffer under a control of the control logic, when data sensed in response to an external address from the second address buffer is output to the outside through the output data latch circuit.

In an embodiment, a sensing operation section is shorter than a data output operation section. In another embodiment, the sensing section is longer than a data output operation section.

In an embodiment, the read circuit includes a row selection circuit controlled by the control logic and selecting rows in response to row address signals of the addresses output from the address buffer circuit; a column selection circuit controlled by the control logic and selecting columns in response to column address signals of the addresses output from the address buffer circuit; and a sensing and latch circuit controlled by the control logic and sensing and latching data from memory cells of the selected rows and columns.

In an embodiment, the addresses used in continuously performing the random read operations are stored in the address buffers of the address buffer circuit during a sensing section of each random read operation.

In an embodiment, the addresses used in continuously performing the random read operations are continuously stored in the address buffers of the address buffer circuit when a first random read operation is performed.

As described above, the flash memory device according to an embodiment allows a data output section of N-th random read operation and a sensing section of (N+1)-th random read operation to overlap each other, so that it is possible to enhance the read speed of the flash memory device.

The above-disclosed subject matter is to be considered illustrative, and not restrictive, and the following claims are intended to cover all such modifications, enhancements, and other embodiments, which fall within the true spirit and scope of this description. Thus, to the maximum extent allowed by law, the scope of the following claims and their equivalents is to be determined by the broadest permissible interpretation.

What is claimed is:

1. A flash memory device comprising:
a memory cell array;
an address buffer circuit including a plurality of address buffers, each address buffer configured to store an address for a random read operation, wherein the address buffer circuit is configured to store an address in one of the address buffers during a sensing section of each random read operation;
a read circuit configured to sense data from the memory cell array in response to an address output from the address buffer circuit;
an output data latch circuit configured to receive data sensed by the read circuit; and
a control logic coupled to the address buffer circuit, the read circuit, and the output data latch circuit, and configured to control the output data latch circuit and the read circuit such that the output data latch circuit outputs first data read from the memory cell array substantially simultaneously as the read circuit senses second data from the memory cell array.

2. The flash memory device of claim 1, wherein the control logic is configured to control the address buffer circuit to output addresses stored in address buffers to the read circuit in a first-in first-out manner.

3. The flash memory device of claim 1, wherein the address buffer circuit comprises first to third address buffers.

4. The flash memory device of claim 3, wherein the read circuit is configured to sense data in the memory cell array corresponding to a first address output from the first address buffer in response to a control of the control logic substantially simultaneously as a second address is stored in the second address buffer.

5. The flash memory device of claim 3, wherein the read circuit is configured to sense data in the memory cell array corresponding to a second address output from the second address buffer in response to a control of the control logic substantially simultaneously as a third address is stored in the third address buffer and the output data latch circuit outputs data sensed from a location in the memory cell array corresponding to a first address stored in the first address buffer.

6. The flash memory device of claim 3, wherein the read circuit is configured to sense data in the memory cell array corresponding to a third address output from the third address buffer in response to a control of the control logic substantially simultaneously as the output data latch circuit outputs data sensed from a location in the memory cell array corresponding to a second address stored in the second address buffer.

7. The flash memory device of claim 1, wherein a time for a sensing operation is shorter than a time for a data output operation.

8. The flash memory device of claim 1, wherein a time for a sensing operation is longer than a time for a data output operation.

9. The flash memory device of claim 1, wherein the read circuit comprises:
a row selection circuit configured to select rows according to row address signals of an address output from the address buffer circuit in response to the control logic;
a column selection circuit configured to selecting columns according to column address signals of the address output from the address buffer circuit in response to the control logic; and
a sensing and latch circuit configured to sense and latch data from memory cells of the selected rows and columns in response to the control logic.

10. The flash memory device of claim 1, wherein the address buffer circuit is configured to continuously store addresses in the address buffers while a random read operation is being performed.

11. A computing system comprising:
a bus;
a processor coupled to the bus; and
a flash memory device coupled to the bus, the flash memory device including:
a memory cell array;
an address buffer circuit including a plurality of address buffers, each address buffer configured to store an address for a random read operation during a sensing section of the random read operation;
a read circuit configured to sense data from the memory cell array in response to an address output from the address buffer circuit;
an output data latch circuit configured to receive data sensed by the read circuit; and
a control logic coupled to the address buffer circuit, the read circuit, and the output data latch circuit, and configured to control the output data latch circuit and the read circuit such that the output data latch circuit outputs first data read from the memory cell array substantially simultaneously as the read circuit senses second data from the memory cell array.

12. The computing system of claim 11, wherein:
the processor is configured to request a random read operation from the flash memory device before the flash memory device has output data from a previous random read operation from the processor.

13. The computing system of claim 11, wherein:
the flash memory device is configured to output data from a memory location in the memory cell array substantially simultaneously as the flash memory device stores an address in the address buffer.

14. A method of operating a flash memory device, comprising:
storing a first address in an address buffer;
storing a second address in the address buffer;
sensing data in a first memory cell in a memory cell array substantially simultaneously as storing the second address in the address buffer, the first memory cell corresponding to the first address;
outputting the data from the first memory cell; and
sensing data in a second memory cell in the memory cell array substantially simultaneously as outputting the data from the first memory cell, the second memory cell corresponding to the second address.

15. The method of claim 14, further comprising:
activating a word line of the memory cell array in response to a row address of the first address;
activating a bit line of the memory cell array in response to a column address of the first address; and
latching data on the bit line;
wherein storing the second address in the buffer occurs before the latching the data on the bit line ends.

16. The method of claim 14, further comprising:
activating a word line of the memory cell array in response to a row address of the second address;

activating a bit line of the memory cell array in response to a column address of the second address; and latching data on the bit line;

wherein outputting data from the first memory cell occurs before the latching the data on the bit line ends.

17. The method of claim 14, further comprising:

storing a third address in the address buffer; and sensing data in a third memory cell in the memory cell array corresponding to the third address substantially simultaneously as outputting the data from the second memory cell.

18. The method of claim 14, further comprising:

continuously storing addresses in the address buffer while sensing data according to addresses stored in the address buffer.

19. A flash memory device comprising:

a memory cell array;

an address buffer circuit including a plurality of address buffers, each address buffer configured to store an address for a random read operation during a sensing section of the random read operation;

a read circuit configured to sense data from the memory cell array in response to an address output from the address buffer circuit;

an output data latch circuit configured to receive data sensed by the read circuit; and a control logic coupled to the address buffer circuit, the read circuit, and the output data latch circuit;

wherein the read circuit is configured to sense data in the memory cell array corresponding to a first address output from a first address buffer of the plurality of address buffers in response to the control logic substantially simultaneously as a second address is stored in a second address buffer of the plurality of address buffers.

20. The flash memory device of claim 19, wherein the address buffer circuit is configured to store an address in one of the address buffers during a sensing section of each random read operation.

21. The flash memory device of claim 19, wherein the address buffer circuit is configured to continuously store addresses in the address buffers while a random read operation is being performed.

* * * * *